US007002798B2

(12) United States Patent
Seki et al.

(10) Patent No.: US 7,002,798 B2
(45) Date of Patent: Feb. 21, 2006

(54) COOLING STRUCTURE OF PROJECTION TELEVISION

(75) Inventors: Shigeyuki Seki, Suwa (JP); Shigeki Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/768,152

(22) Filed: Feb. 2, 2004

(65) Prior Publication Data
US 2004/0218356 A1     Nov. 4, 2004

(30) Foreign Application Priority Data
Mar. 27, 2003    (JP)    .............................. 2003-087304

(51) Int. Cl.
  *H05K 7/20*    (2006.01)
  *G03B 21/16*   (2006.01)
(52) U.S. Cl. ........................................ 361/695; 353/61
(58) Field of Classification Search ................ 361/681, 361/682, 688–690, 694, 695; 174/16.1, 16.3; 165/80.3, 104.33, 122; 348/836; 349/58, 349/161; 353/57, 61, 119
See application file for complete search history.

(56) References Cited

U.S. PATENT DOCUMENTS

| | | | | |
|---|---|---|---|---|
| 6,104,451 | A * | 8/2000 | Matsuoka et al. | 349/58 |
| 6,450,646 | B1 * | 9/2002 | Ono et al. | 353/57 |
| 6,462,804 | B1 * | 10/2002 | Yamada et al. | 349/161 |
| 6,481,854 | B1 * | 11/2002 | Sugawara et al. | 353/52 |
| 6,533,421 | B2 * | 3/2003 | Ono | 353/61 |
| 6,805,446 | B2 * | 10/2004 | Arai et al. | 353/61 |
| 6,851,810 | B2 * | 2/2005 | Arai et al. | 353/15 |
| 2001/0022650 | A1 * | 9/2001 | Ono | 353/52 |
| 2002/0171777 | A1 * | 11/2002 | Park | 348/748 |
| 2004/0156023 | A1 * | 8/2004 | Tseng et al. | 353/57 |

FOREIGN PATENT DOCUMENTS

JP        A 11-041547       2/1999

* cited by examiner

*Primary Examiner*—Boris Chervinsky
(74) *Attorney, Agent, or Firm*—Oliff & Berridge, PLC

(57) ABSTRACT

A projection television has an upper cabinet and a lower cabinet. The upper cabinet includes a mirror case. A cooling structure includes a first internal duct formed by the joint surface between the mirror case and the lower cabinet, and openings functioning as an inlet and an outlet of the first internal duct are formed in the mirror case, so as to constitute a first cooling flow path for cooling liquid crystal panels of an optical unit provided in the lower cabinet.

10 Claims, 8 Drawing Sheets

COOLING STRUCTURE OF PROJECTION TELEVISION

BACKGROUND OF THE INVENTION

1. Field of the Invention

The present invention relates to a cooling structure of a projection television and, more particularly, to a cooling structure for cooling liquid crystal panels and a light source of an optical unit.

2. Description of the Related Art

Conventionally, a projection television has a cooling structure for cooling the inside where heat is generated. For example, a special part for exclusive use for a flowing path such as a duct is provided in a cabinet as the cooling structure, (for example, Japanese Unexamined Patent Application Publication No. 11-41547).

Since the known cooling structure of a conventional projection television has a special part such as a duct provided in a cabinet, there are disadvantages such as the complexity of structure and expensiveness caused by the cost of parts.

SUMMARY OF THE INVENTION

Accordingly, it is an object of the present invention to provide a simple and inexpensive cooling structure of a projection television.

The projection television has an upper cabinet including a mirror case and a lower cabinet. In the cooling structure according to the present invention, a first internal duct is formed by a joint surface between the mirror case and the lower cabinet, and an inlet and an outlet of the first internal duct are formed in the mirror case so as to constitute a first cooling flow path for cooling liquid crystal panels of an optical unit provided in the lower cabinet. The heat generated by the liquid crystal panels is diffused through the first cooling flow path including the first internal duct formed by the joint surface between the mirror case and the lower cabinet. Therefore, the temperature rise in the liquid crystal panels is suppressed. Since the first internal duct is formed utilizing the joint surface between the mirror case and the lower cabinet, a duct is formed without any additional parts such as a duct member. Therefore, the structure is simplified and the increase in the number of parts is avoided. As a result, the cost is reduced.

Preferably, the first cooling flow path is a closed circular path consisting of a closed space formed by the mirror case and a screen, the above described first internal duct and a chamber that houses the liquid crystal panels of the optical unit. Since the outside air does not enter the first cooling flow path, i.e. the closed path, the first cooling flow path does not need a filter.

Preferably, a second cooling flow path for cooling a light source of the optical unit provided in the lower cabinet is formed and an inlet and an outlet of the path are provided in the lower cabinet on both sides. The outside air enters the second cooling flow path through the inlet. The air cools the light source and then goes out through the outlet. Since the light source is more resistant to dust as compared with the liquid crystal panels, the inlet does not need a filter. Even if a filter is disposed at the inlet, the filter does not need high performance. The liquid crystal panels and the light source are cooled separately by different cooling flow paths depending on their properties.

Preferably, a second internal duct is formed by the joint surface between the mirror case and the lower cabinet and constitutes a part of the second cooling flow path. Since the second internal duct is formed utilizing the joint surface between the mirror case and the lower cabinet, a duct is formed without any additional parts such as a duct member. Therefore, the structure is simplified and the increase in the number of parts is avoided. As a result, the cost is reduced.

Preferably, an air blower is provided in the second cooling flow path. The air blower forces air to flow along the second cooling flow path so as to cool the light source effectively.

Preferably, the first cooling flow path and the second cooling flow path are so arranged as not to meet with each other. Even when the outside air enters the second cooling flow path, the first cooling flow path is not affected and dust does not enter the first cooling flow path.

DESCRIPTION OF THE PREFERRED EMBODIMENTS

First Embodiment

Figure 3:
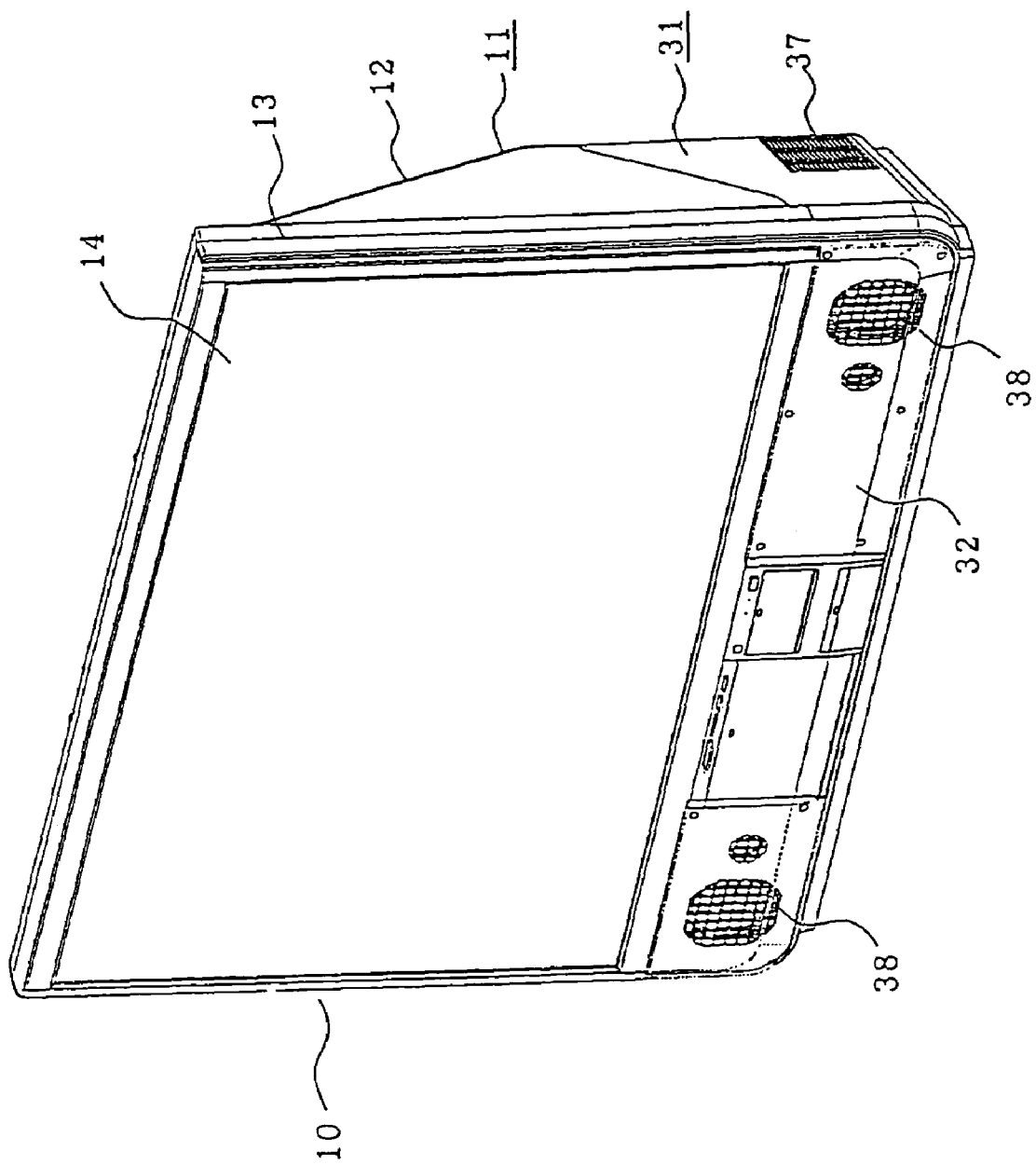
FIG. 3 is a front perspective view of a projection television according to the embodiment.
Figure 4:
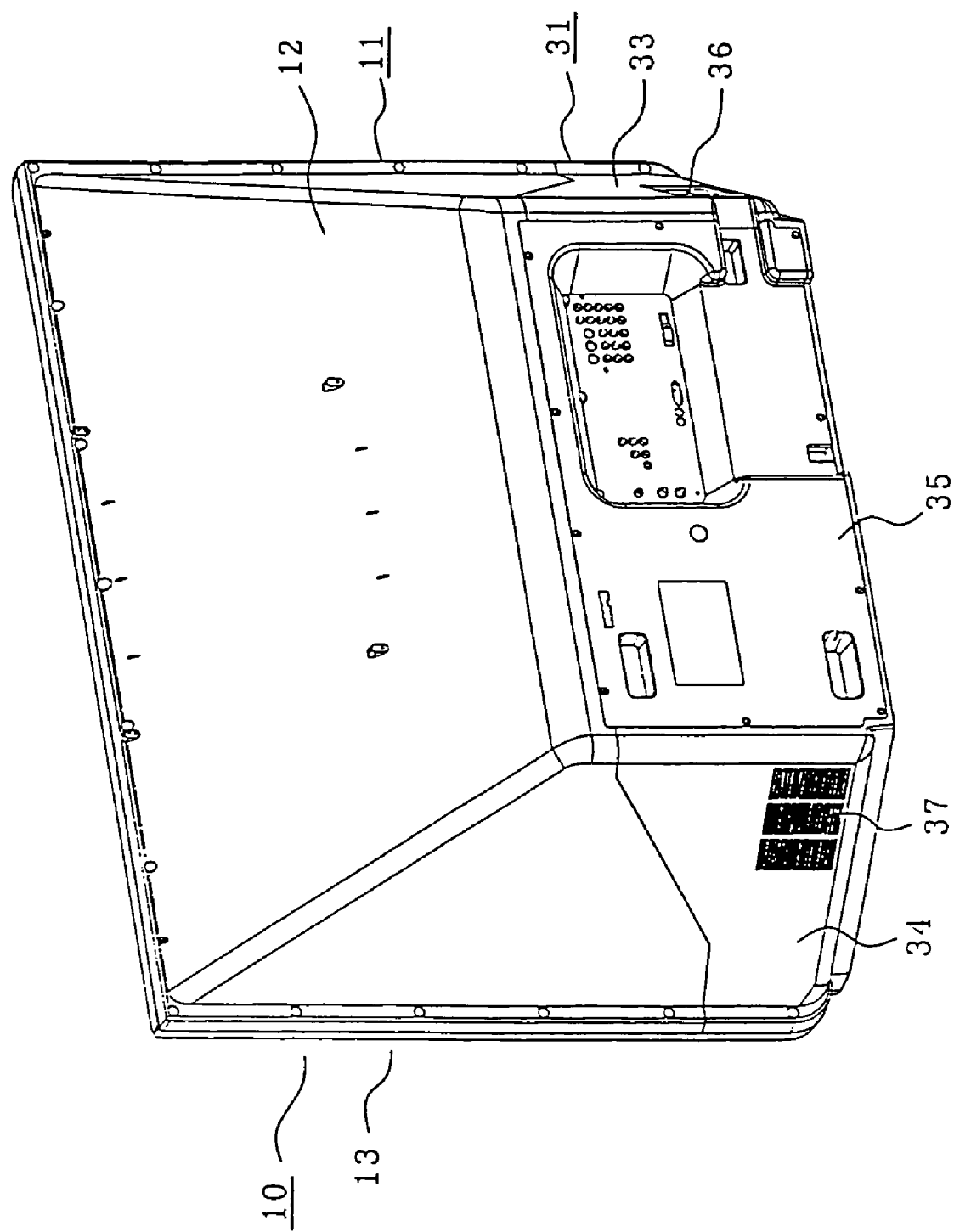
FIG. 4 is a rear perspective view of the projection television.

FIG. 3 is a front perspective view of a projection television, and FIG. 4 is a rear perspective view of the projection television. A cabinet of the projection television 10 is composed of an upper cabinet 11 and a lower cabinet 31, which can be separated from each other. The upper cabinet 11 is provided with a mirror case 12 to which a mirror described later is fitted, a frame 13 which is formed around the front opening of the mirror case 12, and a screen 14 which is set in the frame 13. The lower cabinet 31 has a front panel 32, a left side panel 33, a right side panel 34, and a rear panel 35. An inlet 36 is formed in the left side panel 33 and an outlet 37 is formed in the right side panel 34.

When viewed from above, the projection television 10 is in the shape of a trapezoid. The front base of the trapezoid is longer than the rear base. The oblique sides of the trapezoid represent the right and left sides of the upper cabinet 11 and the lower cabinet 31. Therefore, the side panels 33 and 34 of the lower cabinet 31 are angled. In the angled side panels 33 and 34, as described above, the inlet 36 and the outlet 37 are formed.

The lower cabinet 31 is provided with devices necessary for a projection television excluding the screen 14 and a mirror (not shown) fitted to the upper cabinet. For example, as main components, a projecting device including three liquid crystal panels (R, G, B) and a driving circuit, and a projecting lens are disposed in the middle portion of the lower cabinet 31. To the right or left side of the middle portion (in this embodiment, to the right side when viewed from the front), a detachable light source is disposed. The projecting device, the projecting lens and the light source are named "optical unit" generically. Speakers 38 are disposed on the right and left sides.

Figure 5:
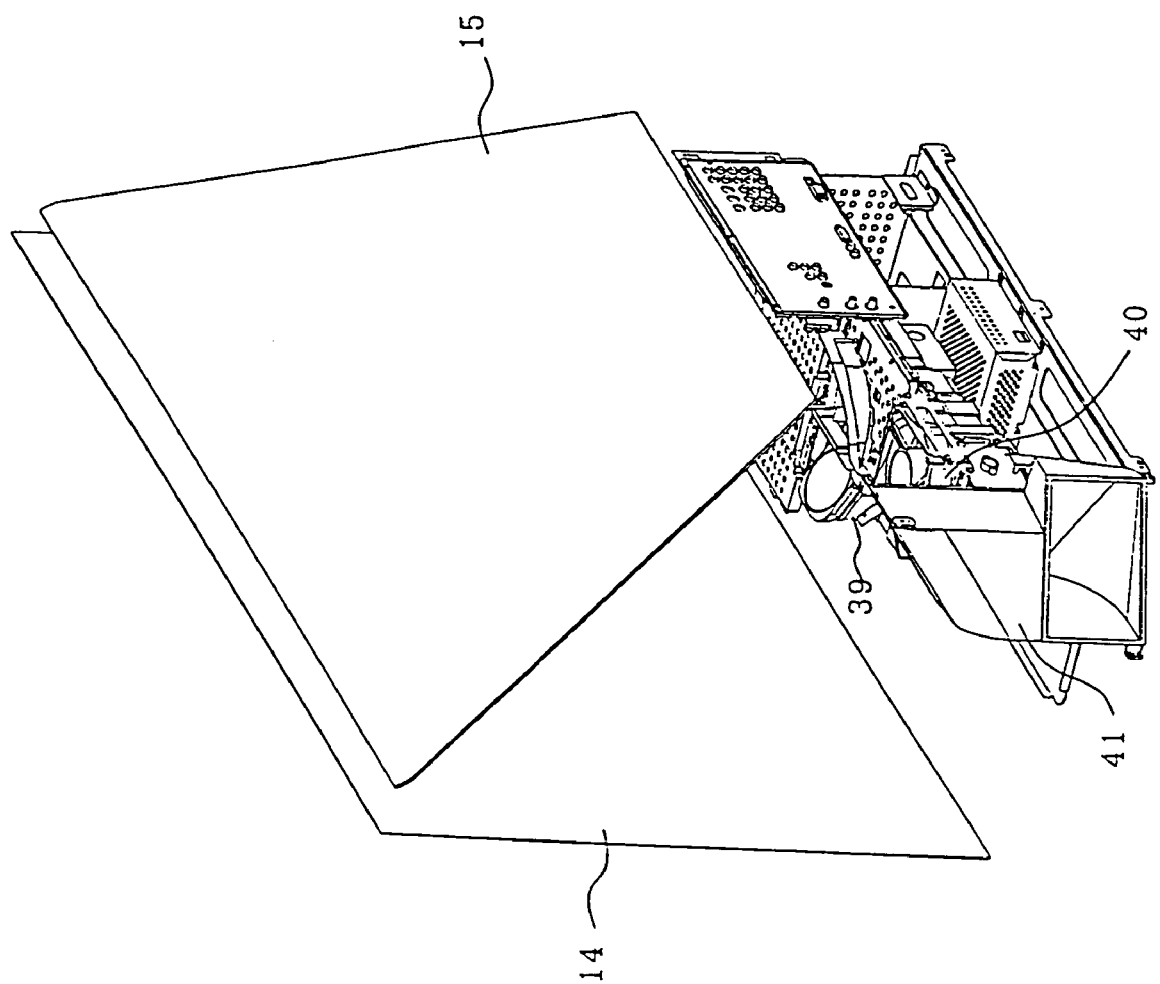
FIG. 5 is a rear perspective view showing the projection television a mirror case and a lower cabinet of which are not depicted.

FIG. 5 is a rear perspective view of the projection television, in which the mirror case 12, the frame 13, the front panel 32, the side panels 33 and 34, and the rear panel 35 are removed from the upper cabinet 11 and the lower cabinet 31 shown in FIGS. 3 and 4. The mirror 15 is fitted to the rear wall of the mirror case 12 and is slanted as shown in FIG. 5. The angle of the mirror 15 is determined so that the image projected from the projecting lens 39 of the optical unit is reflected onto the screen 14. Additionally, an exhaust fan 40 and a duct 41 adjacent to the exhaust fan 40 are disposed in the lower cabinet 31. The duct 41 leads the exhaust air blown by the exhaust fan 40 to the outlet 37.

Figure 6:
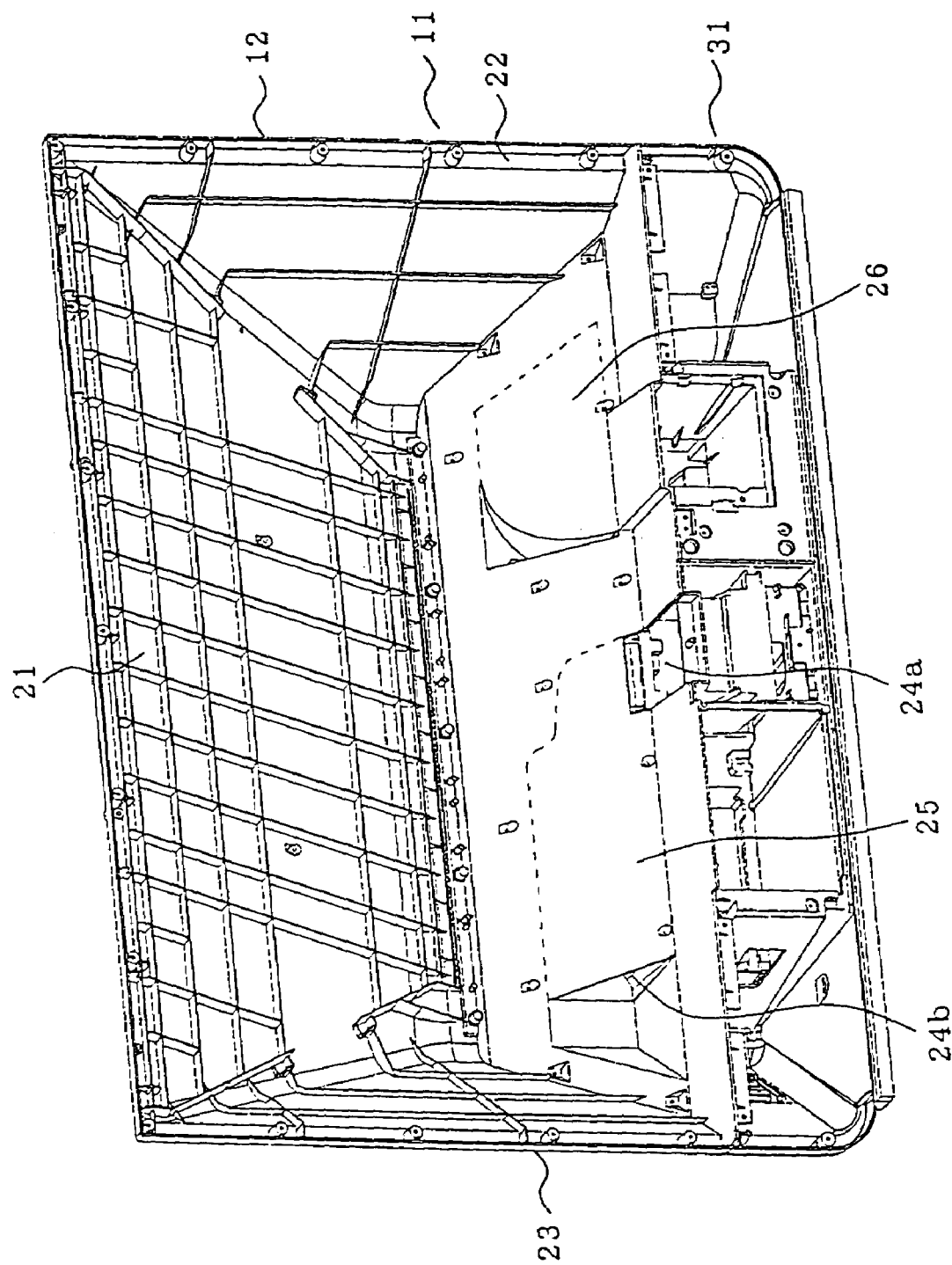
FIG. 6 is a front perspective view showing the mirror case and the lower cabinet a front panel of which is not depicted.
Figure 7:
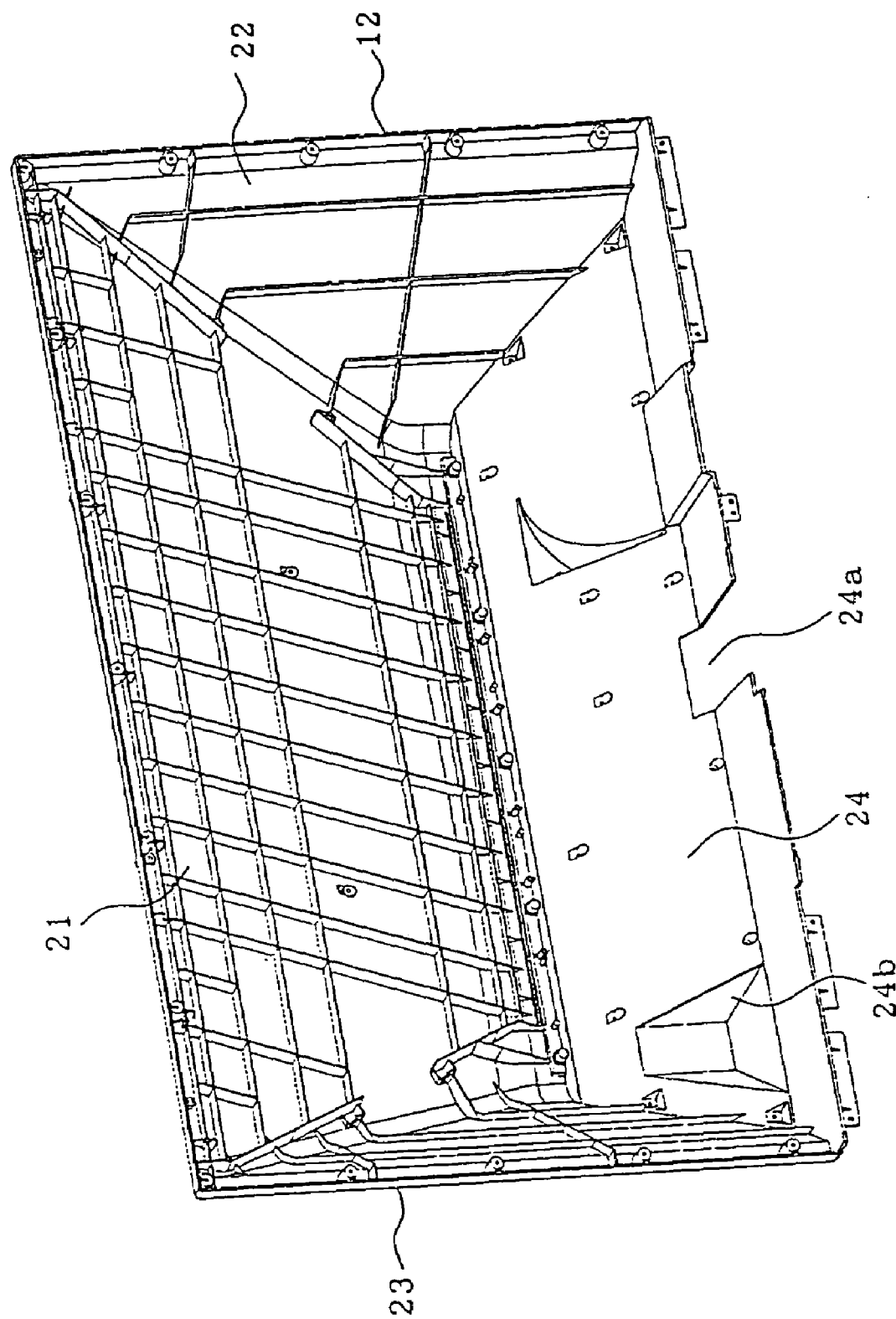
FIG. 7 is a front perspective view of the mirror case.
Figure 8:
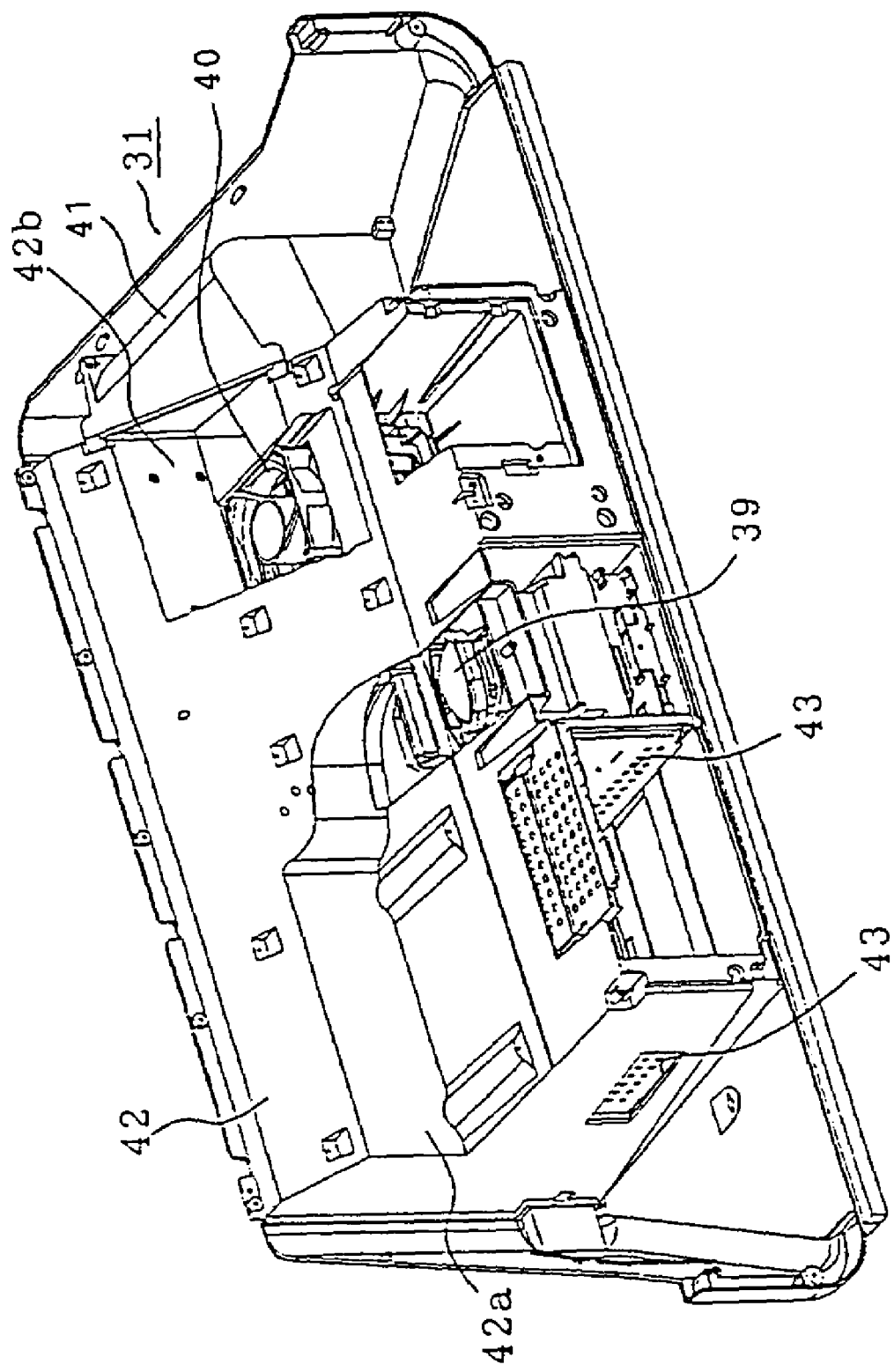
FIG. 8 is a front perspective view showing the lower cabinet the front panel of which is not depicted.

FIG. 6 is a front perspective view in which the frame 13, the screen 14, and the front panel 32 are removed from the upper cabinet 11 and the lower cabinet 31 shown in FIGS. 3 and 4. FIG. 7 is a front perspective view of the mirror case 12 shown in FIG. 6. FIG. 8 is a front perspective view showing the lower cabinet 31 without the front panel 32.

As shown in FIG. 7, the mirror case 12 is composed of a rear wall 21, a pair of side walls 22 and 23, and a bottom wall 24. As described above, the mirror 15 is fitted to the rear wall 21. A part of the bottom wall 24 forms a first internal duct 25 together with the lower cabinet 31 (see FIG. 6). A first opening (a cut portion) 24a as an inlet of a chamber that houses the optical unit including the liquid crystal panels and the projection lens and a second opening 24b as the outlet from the first internal duct 25 are formed in the bottom wall 24. The first opening 24a is formed by cutting in the middle of the front end of the bottom wall 24. The projecting lens 39 of the optical unit is disposed under the first opening 24a. The image produced by the optical unit housed in the lower cabinet is projected through the projecting lens 39 to the mirror 15. An optical path is formed from the lower cabinet 31 to the upper cabinet 11 through the first opening 24a.

As shown in the FIG. 8, two hollows are formed in the top surface 42 of the lower cabinet 31. A first hollow 42a formed on left side is covered by the bottom wall 24 of the mirror case 12, so as to form the first internal duct 25. The first hollow 42a meets with the first opening 24a and second opening 24b at its right and left side ends, respectively. Similarly, a second hollow 42b formed in the top surface 42 of the lower cabinet 31 is covered by the bottom wall 24 of the mirror case 12 to form a second internal duct 26.

On the base side of the lower cabinet 31, a cooling flow path is formed from the inlet 36 to the outlet 37 through the light source, the exhaust fan 40, and the duct 41. As shown in FIG. 8, a hole 43 through which air passes is formed in a partition wall of the lower cabinet 31 to constitute the above-mentioned cooling flow path.

When the mirror case 12 of FIG. 7 and the lower cabinet 31 of FIG. 8 are joined to each other as shown in FIG. 6, the first internal duct 25 and the second internal duct 26 are formed between the mirror case 12 and the lower cabinet 31, thereby forming a first cooling flow path and a second cooling flow path.

Figure 1:
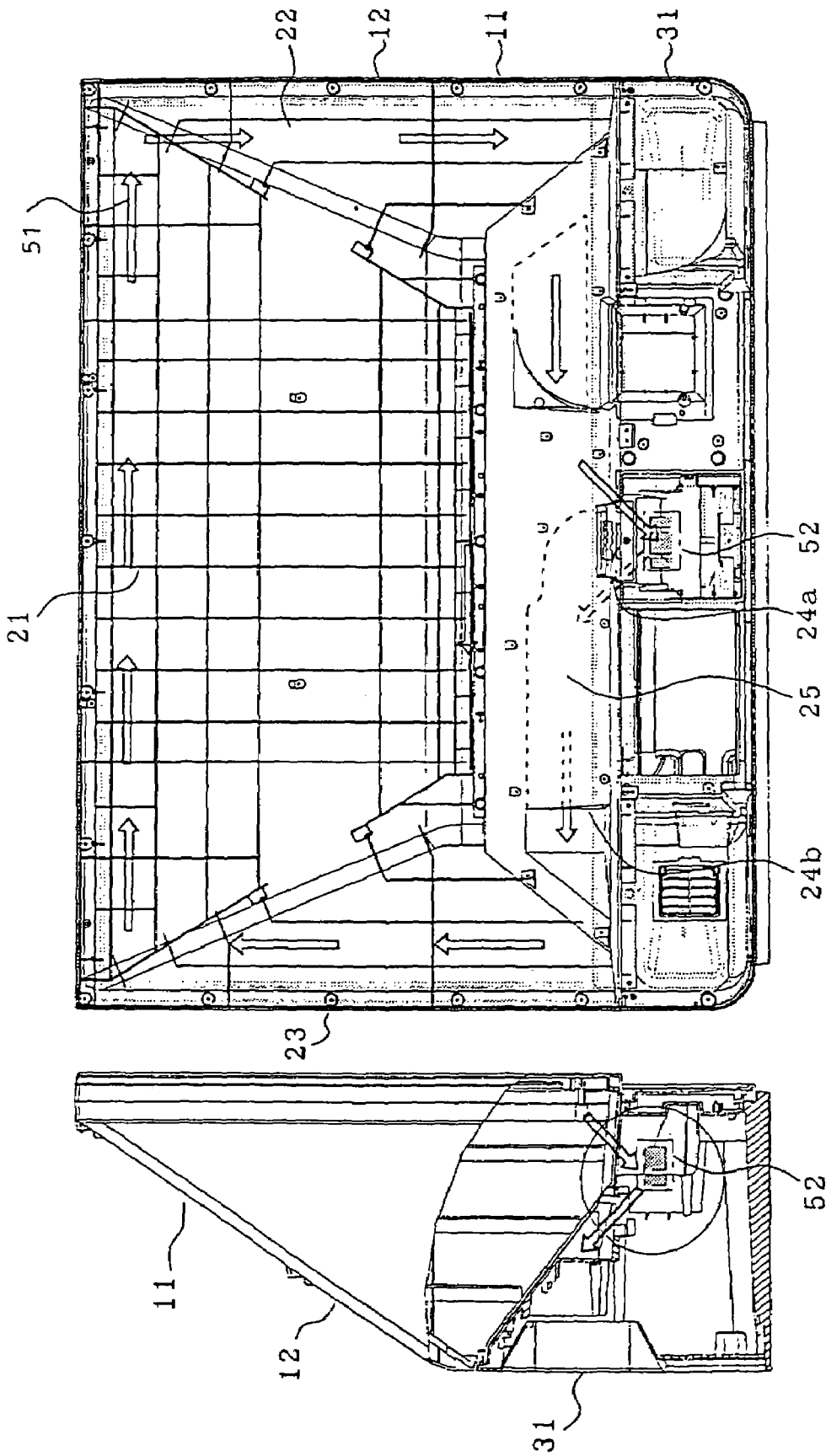
FIGS. 1A and 1B are illustrations of a first cooling flow path according to an embodiment of the present invention.

FIGS. 1A and 1B are illustrations of the first cooling flow path 51. FIG. 1A is a partly sectioned side view of the projection television. FIG. 1B is a front elevational view in which the screen, the mirror, and the front panel are removed from the television shown in FIG. 3. As described above, the first opening 24a formed in the bottom wall 24 of the mirror case 12 communicates with the chamber that houses the optical unit including the liquid crystal panels 52. The chamber of the liquid crystal panels 52 communicates with the first internal duct 25 formed by the bottom wall 24 of the mirror case 12 and the lower cabinet 31. Thus, the first cooling flow path 51 starts from the first opening 24a of the mirror case 12 and returns to the first opening 24a through the chamber of the liquid crystal panels 52, the first internal duct 25, the second opening 24b of the mirror case 12, the left side wall 23 of the mirror case 12, the rear wall 21, and the right side wall 22. The liquid crystal panels 52 of the optical unit function as light valves. Although the liquid crystal panels 52 are heated by the light from the light source, they are cooled by the air flowing along the first cooling flow path 51 and thus the temperature rise is suppressed. In this embodiment, a cooling fan (not shown) is adjacent to the liquid crystal panels 52. The cooling fan forces cooling air to flow along the first cooling flow path 51 to cool the liquid crystal panels 52 effectively.

Figure 2:
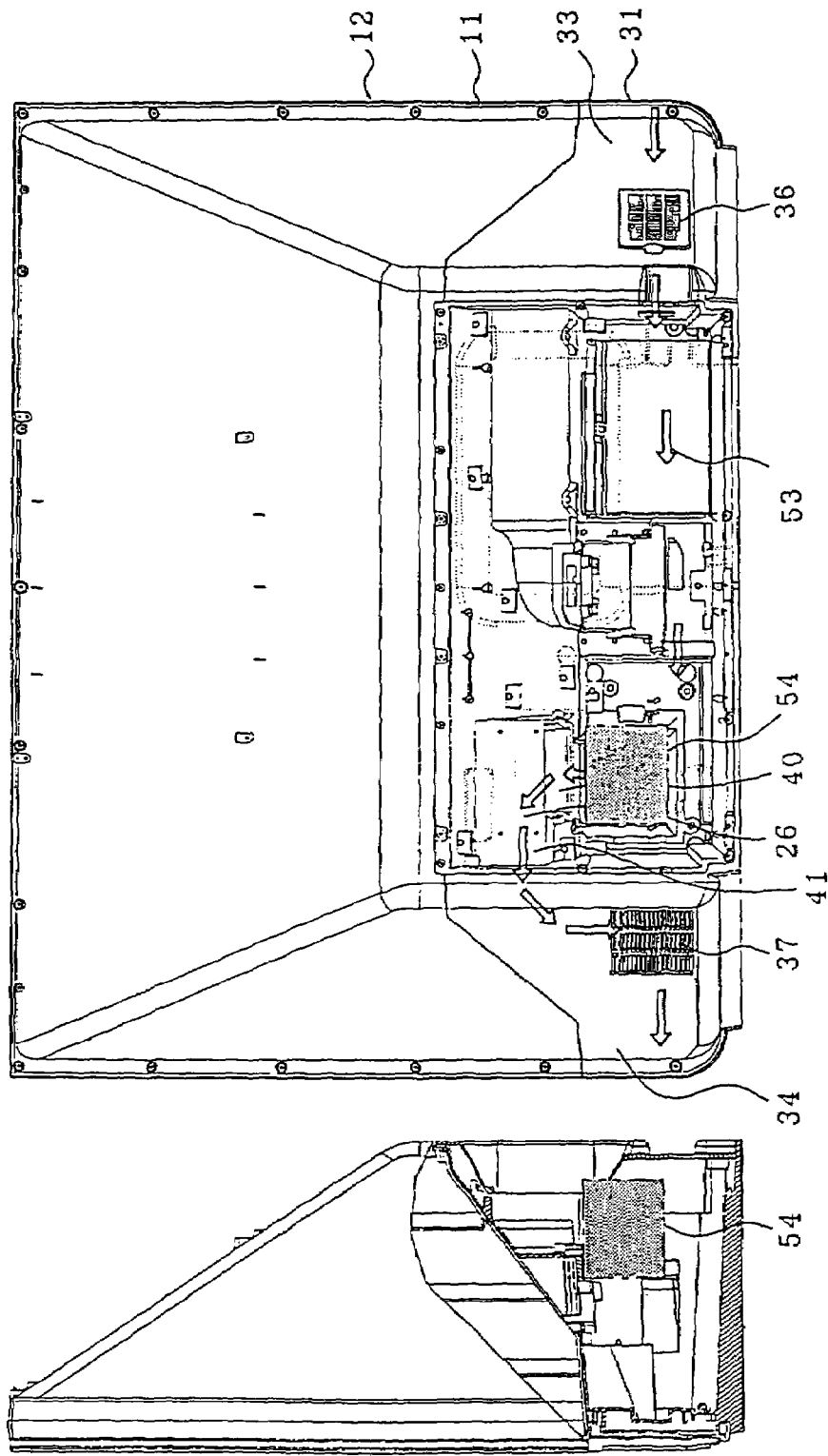
FIGS. 2A and 2B are illustrations of a second cooling flow path according to the embodiment.

FIGS. 2A and 2B are illustrations of the second cooling flow path 53. FIG. 2A is a partly sectioned side view of the projection television. FIG. 2B is a rear elevational view in which the rear panel is removed from the television shown in FIG. 3. As described above, a chamber that houses the light source 54 of the optical unit communicates with the outside of the projection television 10 through the inlet 36 formed in the left side panel 33. The chamber of the light source 54 also communicates with the second internal duct 26 formed by the bottom wall 24 of the mirror case 12 and the lower cabinet 31. The second internal duct 26 is provided with an exhaust fan 40 and communicates with the outside of the projection television 10 through the duct 41 and the outlet 37. Thus, the second cooling flow path 53 starts from the inlet 36 and leads to the outlet 37 through the chamber of the light source 54, the second internal duct 26 (including the exhaust fan 40), and the duct 41. The second cooling flow path 53 is equipped with the exhaust fan 40 which forces cooling air to flow along the second cooling flow path 53 to cool the light source 54 effectively and thus its temperature rise is suppressed. The air that goes out through the outlet 37 (exhaust air) is directed not backward but sideward (in the direction parallel to the screen) or forward.

The optical unit of the projection television includes a light source 54; a uniform lighting optical system having an integrator lens as a uniform lighting optical element; a color separating optical system which separates light beams (W) from the lighting optical system into three color light beams of red, green, and blue (R, G, B); three liquid crystal panels 52 as electro-optical devices for modulating these color light beams; a combining prism as a color combining optical system which combines the modulated color light beams; and a projecting lens which enlarges the combined light beams and projects the beams onto the screen. A plurality of optical elements (lenses) which composes the uniform lighting optical system and the color separating optical system is disposed between the light source 54 and the liquid crystal panels 52. These optical elements are fitted in a unit case (not shown) tightly. Therefore, the air that cooled the liquid crystal panels 52 does not flow to the light source through the unit case. Concerning the outside of the unit case, the space where the liquid crystal panels 52 stands and the space where the light source 54 stands are separated by partitions so as not to communicate with each other. Thus, although both the first cooling flow path 51 and the second cooling flow path 53 face the optical unit, the first cooling flow path 51 and the second cooling flow path 53 are separated and do not meet with each other.

As described above, in this embodiment, the first cooling flow path 51 for cooling the liquid crystal panels 52 does not take in air from outside, and the air in the closed space formed by the mirror case 12, the screen 14, and so on circulate to cool the liquid crystal panels 52. Therefore, no parts such as a filter necessary for taking in air from outside is unnecessary, so that the cooling structure is simplified.

On the other hand, the outside air enters the second cooling flow path 53 for cooling the light source 54. However, the second cooling flow path 53 does not meet with the first cooling flow path 51 and is provided for cooling only the light source 54 (not the liquid crystal panels 52). Since the light source 54 is more resistant to dust as compared with the liquid crystal panels 52, similarly, the second cooling flow path 53 does not need a filter. Therefore, the cooling structure is simplified. Naturally, a filter may be disposed at the inlet 36 of the second cooling flow path 53. However, the filter does not need high performance to remove dust since the liquid crystal panels 52 are not included in the second cooling flow path 53. Additionally, since the heated air is exhausted by the exhaust fan 40, temperature rise inside the lower cabinet is suppressed. Therefore, adverse effects of heat on the devices equipped in the lower cabinet 31 are eliminated.

Since the inlet 36 and the outlet 37 constituting the second cooling flow path 53 are formed in the side panels 33 and 34, the projection television 10 can be placed with no space between its rear surface and a wall of a room. Additionally, the projection television 10 can be placed with no space between its side edge and the wall or an adjoining article of furniture. Even in that case, since the side panels 33 and 34 are angled, a space is secured between the side panel 33 or 34 and the wall. Therefore, the inlet 36 and the outlet 37 are not blocked. Since the exhaust fan 40 (and the cooling fan for cooling the liquid crystal panels 52) is/are disposed not near the exterior wall of the lower cabinet 31 but inside the lower cabinet 31, noise is reduced.

Second Embodiment

In the above first embodiment, an example is described which is equipped with a cooling fan (not shown) placed near liquid crystal panels 52 in the first cooling flow path 51. However, the air in the first cooling flow path 51 may be circulated without a fan by natural convection caused by heat from the liquid crystal panels 52. The shapes of the mirror case 12 and the lower cabinet 31 constituting the first cooling flow path 51 and the second cooling flow path 53 are not limited to the above-described embodiment, and various changes may be made.

What is claimed is:

1. A cooling structure of a projection television, comprising:
    an upper cabinet including a mirror case;
    a lower cabinet; and
    a first internal duct formed by a joint surface between the mirror case and the lower cabinet and an inlet and an outlet of the first internal duct formed in the mirror case, so as to constitute a first cooling flow path for cooling liquid crystal panels of an optical unit provided in the lower cabinet and a second cooling flow path which has an inlet and an outlet formed in both side portions of the lower cabinet, for cooling a light source of the optical unit provided in the lower cabinet.

2. The cooling structure of a projection television according to claim 1, wherein the first cooling flow path is a closed circular path consisting of a closed space formed by the mirror case and a screen, a chamber that houses the liquid crystal panels and the first internal duct.

3. The cooling structure of a projection television according to claim 1, further comprising a second internal duct is formed by the joint surface between the mirror case and the lower cabinet and constitutes a part of the second cooling flow path.

4. The cooling structure of a projection television according to claim 1, further comprising an air blower provided in the second cooling flow path.

5. The cooling structure of a projection television according to claim 1, wherein the first cooling flow path and the second cooling flow path are arranged so as not to meet with each other.

6. The cooling structure of a projection television according to claim 2, wherein the cooling structure further comprises a second cooling flow path which has an inlet and an outlet formed in both side portions of the lower cabinet, for cooling a light source of the optical unit provided in the lower cabinet.

7. The cooling structure of a projection television according to claim 3, further comprising an air blower provided in the second cooling flow path.

8. The cooling structure of a projection television according to claim 3, wherein the first cooling flow path and the second cooling flow path are arranged so as not to meet with each other.

9. The cooling structure of a projection television according to claim 4, wherein the first cooling flow path and the second cooling flow path are arranged so as not to meet with each other.

10. A cooling structure of a projection television, comprising:
    an upper cabinet including a mirror case that includes opposing side walls;
    a lower cabinet; and
    a first internal duct horizontally formed by a joint surface between the mirror case and the lower cabinet, an inlet and an outlet of the first internal duct formed in the mirror case, so as to constitute a first cooling flow path for cooling liquid crystal panels of an optical unit provided in the lower cabinet.

* * * * *